(12) United States Patent
Yamasaki

(10) Patent No.: US 11,259,411 B2
(45) Date of Patent: Feb. 22, 2022

(54) WIRING SUBSTRATE AND METHOD FOR MANUFACTURING WIRING SUBSTRATE

(71) Applicant: IBIDEN CO., LTD., Gifu (JP)

(72) Inventor: Katsuyoshi Yamasaki, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/096,299

(22) Filed: Nov. 12, 2020

(65) Prior Publication Data
US 2021/0153350 A1 May 20, 2021

(30) Foreign Application Priority Data
Nov. 15, 2019 (JP) .............................. JP2019-207365

(51) Int. Cl.
*H05K 1/02* (2006.01)
*H05K 3/40* (2006.01)
*H05K 1/11* (2006.01)

(52) U.S. Cl.
CPC ........... *H05K 1/113* (2013.01); *H05K 1/0296* (2013.01); *H05K 3/4038* (2013.01); *H05K 2201/0939* (2013.01); *H05K 2201/09381* (2013.01)

(58) Field of Classification Search
CPC .............. H05K 1/0284; H05K 1/0296; H05K 3/40–4092
See application file for complete search history.

(56) References Cited

FOREIGN PATENT DOCUMENTS

JP 2007-141975 A 6/2007

*Primary Examiner* — Jeremy C Norris
(74) *Attorney, Agent, or Firm* — Oblon, McClelland, Maier & Neustadt, L.L.P.

(57) ABSTRACT

A wiring substrate includes an insulating layer, and a conductor layer formed on the insulating layer and including a mesh-like conductor pattern and conductor pads such that the mesh-like conductor pattern has openings exposing the insulating layer and that the conductor pads are formed at substantially centers of selected ones or all of the openings respectively. The conductor layer is formed such that each of the openings has a polygonal shape, that gaps are formed between the conductor pads and the conductor pattern surrounding the conductor pads, and that each of the conductor pads has a curved outer edge.

20 Claims, 10 Drawing Sheets

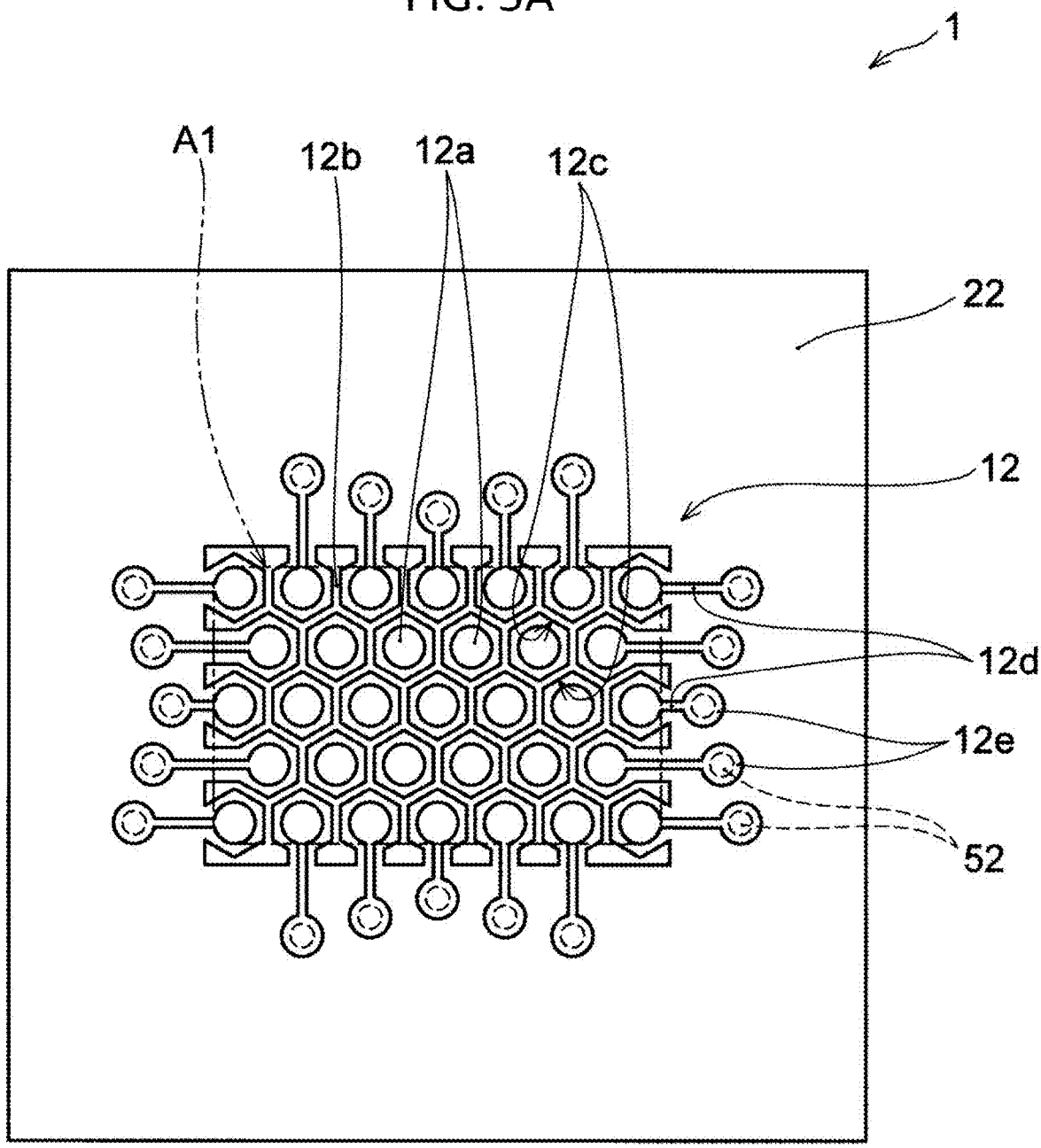

WIRING SUBSTRATE AND METHOD FOR MANUFACTURING WIRING SUBSTRATE

CROSS-REFERENCE TO RELATED APPLICATIONS

The present application is based upon and claims the benefit of priority to Japanese Patent Application No. 2019-207365, filed Nov. 15, 2019, the entire contents of which are incorporated herein by reference.

BACKGROUND OF THE INVENTION

Field of the Invention

The present invention relates to a wiring substrate and a method for manufacturing the wiring substrate.

Description of Background Art

Japanese Patent Application Laid-Open Publication No. 2007-141975 describes a printed wiring substrate having an inner-layer conductor that includes multiple conductor pads. A wide-area conductor region is formed around the multiple conductor pads. Between adjacent conductor pads, a bridge part is provided connecting a conductor region surrounded by multiple conductor pads to the wide-area conductor region. The individual conductor pads are surrounded with clearance by surrounding conductors, such as the wide-area conductor region. The entire contents of this publication are incorporated herein by reference.

SUMMARY OF THE INVENTION

According to one aspect of the present invention, a wiring substrate includes an insulating layer, and a conductor layer formed on the insulating layer and including a mesh-like conductor pattern and conductor pads such that the mesh-like conductor pattern has openings exposing the insulating layer and that the conductor pads are formed at substantially centers of selected ones or all of the openings respectively. The conductor layer is formed such that each of the openings has a polygonal shape, that gaps are formed between the conductor pads and the conductor pattern surrounding the conductor pads, and that each of the conductor pads has a curved outer edge.

According to another aspect of the present invention, a method for manufacturing a wiring substrate includes forming an insulating layer, and forming a conductor layer on the insulating layer, wherein the forming of the conductor layer includes forming a resist film for forming the conductor layer including a mesh-like conductor pattern and conductor pads, forming the mesh-like conductor pattern having openings such that each of the openings has a polygonal shape, and forming the conductor pads at substantially centers of selected ones of or all of the openings respectively such that each of the conductor pads has a curved outer edge and that gaps are formed between the conductor pads and the surrounding conductor pattern.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5A is a plan view illustrating an example of a lower-layer conductor layer of the wiring substrate of the embodiment according to the present invention;

DETAILED DESCRIPTION OF THE EMBODIMENTS

Figure 1:
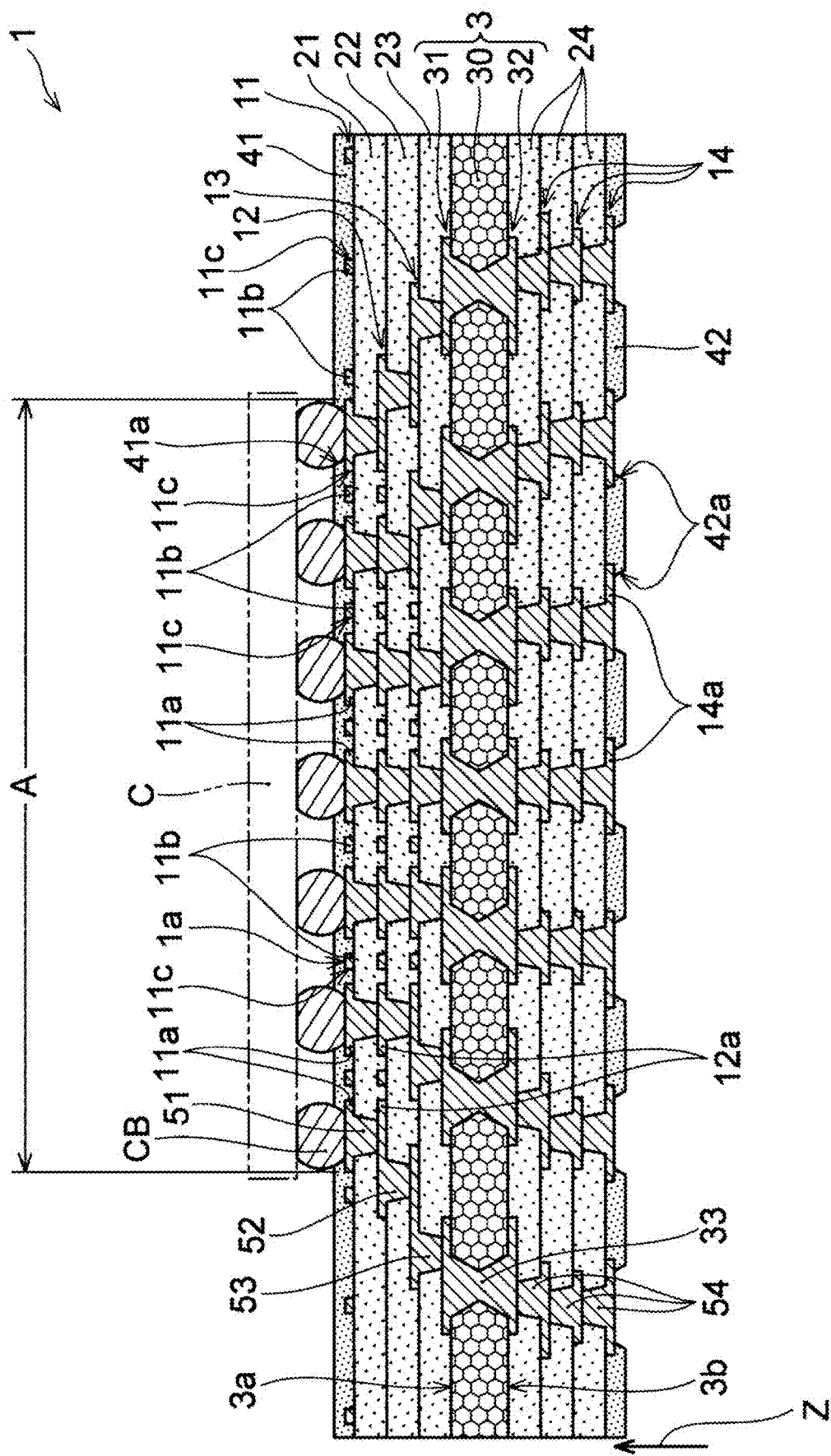
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

Figure 2:
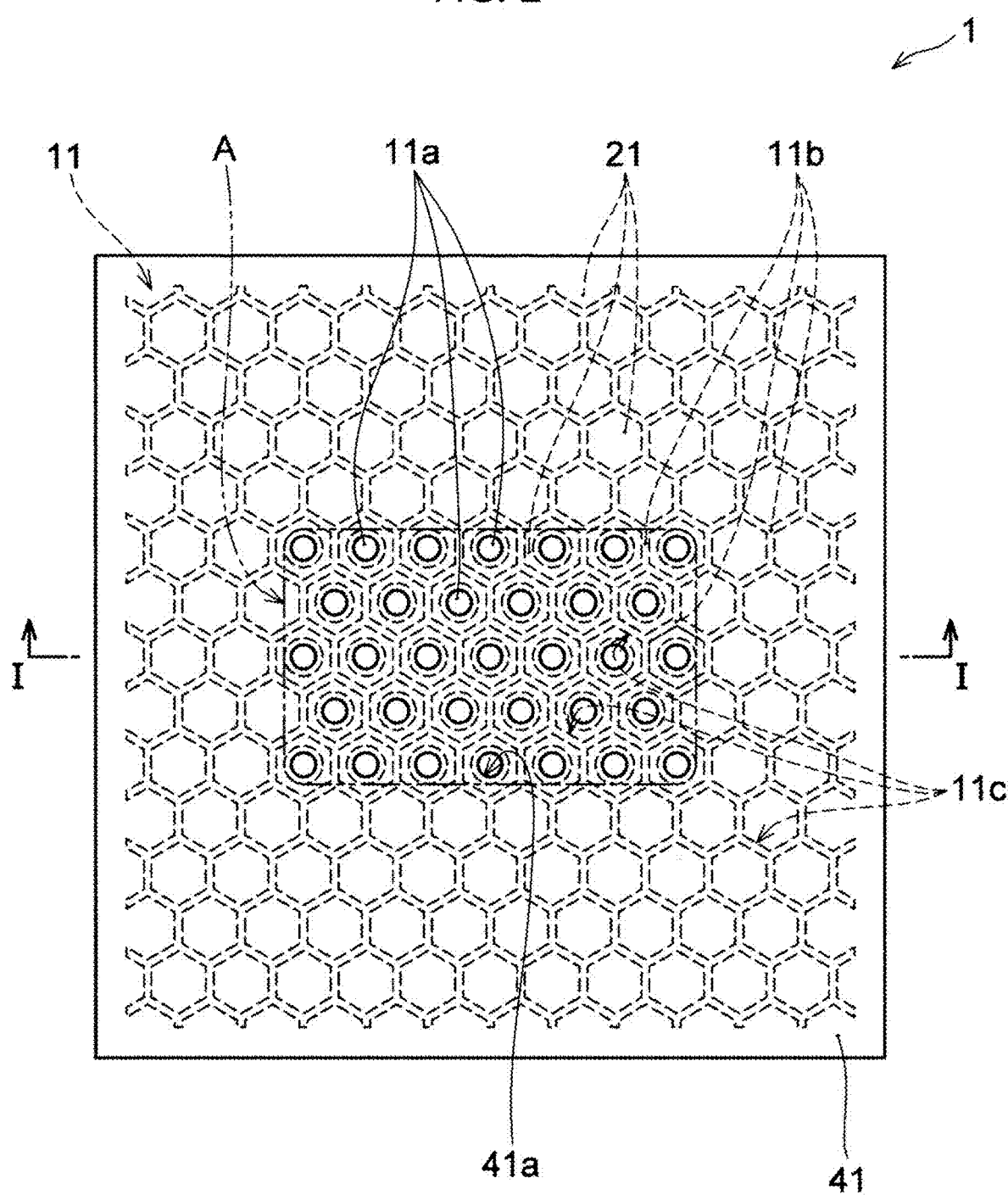
FIG. 2 is a plan view illustrating an example of the wiring substrate according to the embodiment of the present invention.

A wiring substrate of an embodiment of the present invention is described with reference to the drawings. FIGS. 1 and 2 respectively illustrate a cross-sectional view and a plan view of a wiring substrate 1 which is an example of the wiring substrate of the embodiment. FIG. 1 is a cross-sectional view along an I-I line illustrated in FIG. 2.

As illustrated in FIGS. 1 and 2, the wiring substrate 1 includes a core substrate 3, and insulating layers (insulating layers (21-23)) and conductor layers (conductor layers (11-13)), the core substrate 3 having a first surface (3a) and a second surface (3b) on an opposite side with respect to the first surface (3a), and the insulating layers (insulating layers (21-23)) and the conductor layers (conductor layers (11-13))

being laminated on the first surface (3a) side of the core substrate 3. The wiring substrate 1 of FIG. 1 further includes three insulating layers 24 and three conductor layers 14 which are alternately laminated on the second surface (3b) of the core substrate 3. The core substrate 3 includes an insulating layer 30 (core insulating layer), a conductor layer 31 (first core substrate conductor layer) formed on a surface on the first surface (3a) side, and a conductor layer 32 (second core substrate conductor layer) formed on a surface on the second surface (3b) side. On the first surface (3a) of the core substrate 3, the insulating layer 23 (third insulating layer), the conductor layer 13 (third conductor layer), the insulating layer 22 (second insulating layer), the conductor layer 12 (second conductor layer), the insulating layer 21 (first insulating layer), and the conductor layer 11 (first conductor layer) are formed in this order. The wiring substrate 1 in the example of FIG. 1 is a multilayer wiring substrate including eight conductor layers. However, it is sufficient for the wiring substrate 1 of the present embodiment to have at least one insulating layer and one conductor layer. Further, the wiring substrate 1 may be a so-called coreless substrate that does not include the core substrate 3.

In the description of the wiring substrate 1, a side farther from the insulating layer 30 in a thickness direction of the wiring substrate 1 is also referred to as an "upper side" or simply "upper," and a side closer to the insulating layer 30 is also referred to as a "lower side" or simply "lower." Further, for the conductor layers and the insulating layers, a surface facing an opposite side with respect to the insulating layer 30 is also referred to as an "upper surface," and a surface facing the insulating layer 30 side is also referred to as a "lower surface." Further, in the description of the embodiments, the thickness direction of the wiring substrate 1 is also simply referred to as a "Z direction."

The insulating layers (21-24) and the insulating layer 30 each are formed of any insulating resin. Examples of the insulating resin include an epoxy resin, a bismaleimide triazine resin (BT resin), a phenol resin, and the like. The insulating layers formed using these insulating resins may each contain inorganic filler such as silica. Further, the insulating layer 30 may contain a reinforcing material (not illustrated in the drawings) formed of a glass fiber, an aramid fiber, a glass non-woven fabric, an aramid non-woven fabric and the like in order to have an appropriate rigidity. The insulating layers (21-24) also may each contain a reinforcing material. However, from a point of view of plating adhesion when the conductor layers are formed, the insulating layers (21-24) each may be formed of a resin that does not contain a reinforcing material.

The conductor layers (11-14) and the conductor layers (31, 32) can each be formed of, for example, a metal foil, a vapor-deposited film or a plating film alone or a laminate of these, the metal foil, the vapor-deposited film or the plating film containing copper, nickel, silver or the like. For example, the conductor layers each may include a copper foil, a plating base film used as a power feeding layer for electrolytic plating, and a copper electrolytic plating film. The plating base film is, for example, a copper electroless plating film or sputtering film.

In the example of FIGS. 1 and 2, the conductor layer 11 includes multiple conductor pads (11a). The conductor pads (11a) are mounting pads connected to an external component (C). Examples of the component (C) include any semiconductor integrated circuit device such as a microcomputer, a gate array, an integrated circuit device for a specific application, and any digital or analog general-purpose integrated circuit device. In the example of FIG. 1, the wiring substrate 1 has conductive bumps (CB) that are respectively formed on the conductor pads (11a). The conductive bumps (CB) are formed of any conductive material such as solder or copper. The component (C) is connected to the conductor pads (11a) via the conductive bumps (CB). A surface (exposed surface) of the wiring substrate 1 on the conductor layer 11 side is also referred to as a "component mounting surface (1a)" for convenience. The conductor pads (11a) which are mounting pads are provided on the component mounting surface (1a). An external component can also be mounted on a surface on an opposite side with respect to the conductor layer 11. In FIG. 2 and in FIGS. 3 and 4 (to be described later), illustration of the conductive bumps (CB) is omitted.

The outermost conductor layer 14 among the three conductor layers 14 includes connection pads (14a) connecting to an external component (not illustrated in the drawings). Examples of an external component connected to the connection pads (14a) include a motherboard of an electronic device in which the wiring substrate 1 is used, a base substrate of a system-in-package (SIP) in which the wiring substrate 1 is used, and the like.

Via conductors (51-54) are respectively formed in the insulating layers (21-24). Through-hole conductors 33 are formed in the insulating layer 30. Each of the via conductors (51-54) and the through-hole conductors 33 electrically connects conductor layers sandwiching the insulating layer containing the conductor itself. In the example of FIG. 1, the via conductors (51-54) each have a tapered shape that is reduced in outer diameter (width) toward the core substrate 3. Further, the through-hole conductors 33 each have an outer diameter (width) that decreases from both the first surface (3a) side and the second surface (3b) side toward a center part of the core substrate 3 in the Z direction, and each have a constriction in the center part in the Z direction.

Each of the via conductors (51-54) is integrally formed with the conductor layer on an upper side of the conductor by any metal such as copper or nickel, and can include an electroless plating film or a vapor-deposited film, and an electrolytic plating film. Each of the through-hole conductors 33 is integrally formed with the conductor layer 31 and the conductor layer 32 by any metal such as copper or nickel, and can include an electroless plating film or a vapor-deposited film, and an electrolytic plating film.

The wiring substrate 1 of FIG. 1 further includes solder resist layers (41, 42). The solder resist layer 41 is formed on the conductor layer 11 and the insulating layer 21. The solder resist layer 42 is formed on the insulating layer 24 and the conductor layer 14 on the most surface side among the three insulating layers 24 and the three conductor layers 14, respectively. The solder resist layers (41, 42) each are formed using any insulating material, for example, a photosensitive resin containing an epoxy resin or a polyimide resin as a main raw material. The solder resist layer 41 has openings (41a) that respectively expose the conductor pads (11a). In the example of FIG. 1, the openings (41a) are respectively individually provided for the conductor pads (11a). That is, the multiple openings (41a) are provided, and the openings (41a) respectively individually expose the conductor pads (11a). The solder resist layer 42 has openings (42a) that respectively individually expose the connection pads (14a). The solder resist layer 41 may have an opening that collectively exposes multiple conductor pads (11a) (for example, all the conductor pads (11a)) therein.

In the wiring substrate 1, the conductor layers (11-14) and the conductor layers (31, 32) each can include any conductor pattern. In the wiring substrate 1 of FIGS. 1 and 2, the conductor layer 11 includes a mesh-like conductor pattern (11b) (first mesh pattern). The conductor layer 11 is a surface-layer conductor layer laminated on the outermost side among the conductor layers laminated on the first surface (3a) side of the core substrate 3. The mesh-like conductor pattern (11b) has multiple openings (11c) that expose the insulating layer 21. The insulating layer 21 is a surface-layer insulating layer laminated on the outermost side among the insulating layers that are laminated on the first surface (3a) side of the core substrate 3.

The conductor layer 11 includes a component mounting region (A) where the external component (C) is mounted. The "component mounting region" is a region corresponding to the external component (C) mounted on the conductor layer 11. For example, the component mounting region (A) is a region covered by a package of the external component (C). Further, as illustrated in FIGS. 1 and 2, the component mounting region (A) is a region surrounded by multiple conductor pads (11a) formed on an outermost periphery among a group of conductor pads (11a) connected to the component (C).

In the example of FIGS. 1 and 2, the mesh-like conductor pattern (11b) is formed on substantially an entire upper surface of the insulating layer 21. The component mounting region (A) includes a part of the mesh-like conductor pattern (11b) formed on substantially the entire surface of the insulating layer 21. Without being limited to the example of FIG. 2, the mesh-like conductor pattern (11b) may be formed partially, that is, only in a predetermined partial region, on the upper surface of the insulating layer 21. For example, the mesh-like conductor pattern (11b) may be formed only in the component mounting region (A). In that case, the component mounting region (A) can include the entire mesh-like conductor pattern (11b).

Figure 3:
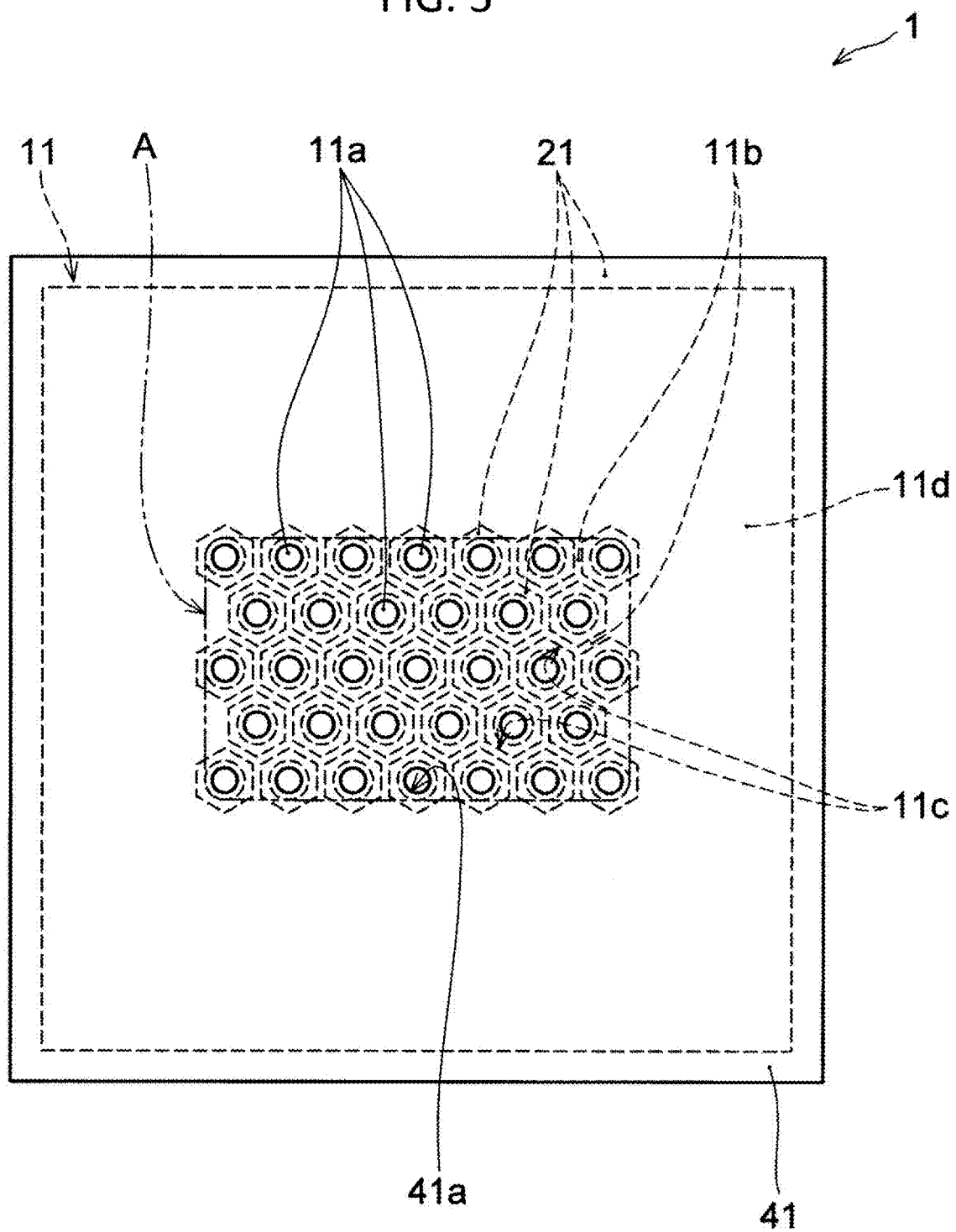
FIG. 3 is a plan view illustrating another example of a conductor layer of the wiring substrate according to the embodiment.

As illustrated in FIG. 3, when the mesh-like conductor pattern (11b) is partially formed on the upper surface of the insulating layer 21, a so-called solid pattern (11d) may be formed extending continuously so as to fill a region where the mesh-like conductor pattern (11b) is not formed. That is, the conductor layer 11 may include the solid pattern (11d) surrounding the mesh-like conductor pattern (11b).

In the example of FIGS. 1-3, the conductor layer 11 includes the above-described conductor pads (11a), and the conductor pads (11a) are respectively formed inside the multiple openings (11c) of the mesh-like conductor pattern (11b). The conductor pads (11a) are respectively formed at substantially centers of the openings (11c), and gaps are formed between the conductor pads (11a) and the conductor pattern (11b) surrounding the conductor pads (11a). That is, the conductor pads (11a) each are separated from the conductor pattern (11c) and are each independent of the conductor pattern (11c). In a plan view, each of the conductor pads (11a) is surrounded by the insulating layer 21. The conductor pads (11a) may be formed inside only some of the multiple openings (11c) as in the example of FIGS. 1-3, or may be formed inside all of the multiple openings (11c).

In the example of FIGS. 1-3, as described above, the conductor pads (11a) are mounting pads on which the external component (C) is mounted. Therefore, in the example of FIGS. 1-3, the conductor pads (11a) are formed only in the openings (11c) inside the component mounting region (A), and are not formed in the openings (11c) outside the component mounting region (A). However, conductor pads that are not connected to an external component may be formed in the openings (11c) outside the component mounting region (A). It is possible that uniformly of a so-called residual copper rate in the conductor layer 11 is increased, and distortion or warpage is unlikely to occur in the wiring substrate 1.

The conductor pads (11a) are formed in all the multiple openings (11c) on a one-to-one basis in the component mounting region (A). Multiple conductor frames forming the mesh-like conductor pattern (11b) respectively surround the conductor pads (11a) around the openings (11c). That is, the conductor frames forming the mesh-like conductor pattern (11b) can function as an electromagnetic shield of the conductor pads (11a) connected to the component (C). Therefore, it is preferable that the conductor pads (11a) are formed inside the openings (11c) on a one-to-one basis. It is possible that a good shielding effect with respect to each of the conductor pads (11a) is obtained.

Also when conductor pads (11a) are formed in the openings (11c) outside the component mounting region (A), the conductor pads (11a) may be formed inside all the openings (11c) on a one-to-one basis outside the component mounting region (A). Further, even when the conductor pads (11a) are not formed inside some of the openings (11c) outside the component mounting region (A), the conductor pads (11a) can be formed at least in all the openings (11c) on a one-to-one basis inside the component mounting region (A).

The multiple openings (11c) of the mesh-like conductor pattern (11b) illustrated in FIG. 2 and the like have substantially the same size and shape as each other. Although it is not necessary that the multiple openings (11c) have the same size and shape as each other, at least the multiple openings (11c) included within the component mounting region (A) can have substantially the same size and shape as each other. As described above, the conductor pads (11a) formed in the openings (11c) are mounting pads in the example of FIGS. 1-3. When the multiple openings (11c) in the component mounting region (A) have substantially the same size and shape as each other, for example, it is possible that multiple terminals formed two-dimensionally at a uniform pitch in the component (C) can be appropriately positioned to oppose the conductor pads (11a).

In the wiring substrate 1 of the present embodiment, each of the multiple openings (11c) has a polygonal shape. In the example of FIGS. 1-3, each of the openings (11c) has a hexagonal shape, specifically, a regular hexagonal shape. On the other hand, each of the conductor pads (11a) has a circular shape, specifically, a substantially perfect circular shape, and has a curved outer edge.

Figure 4:
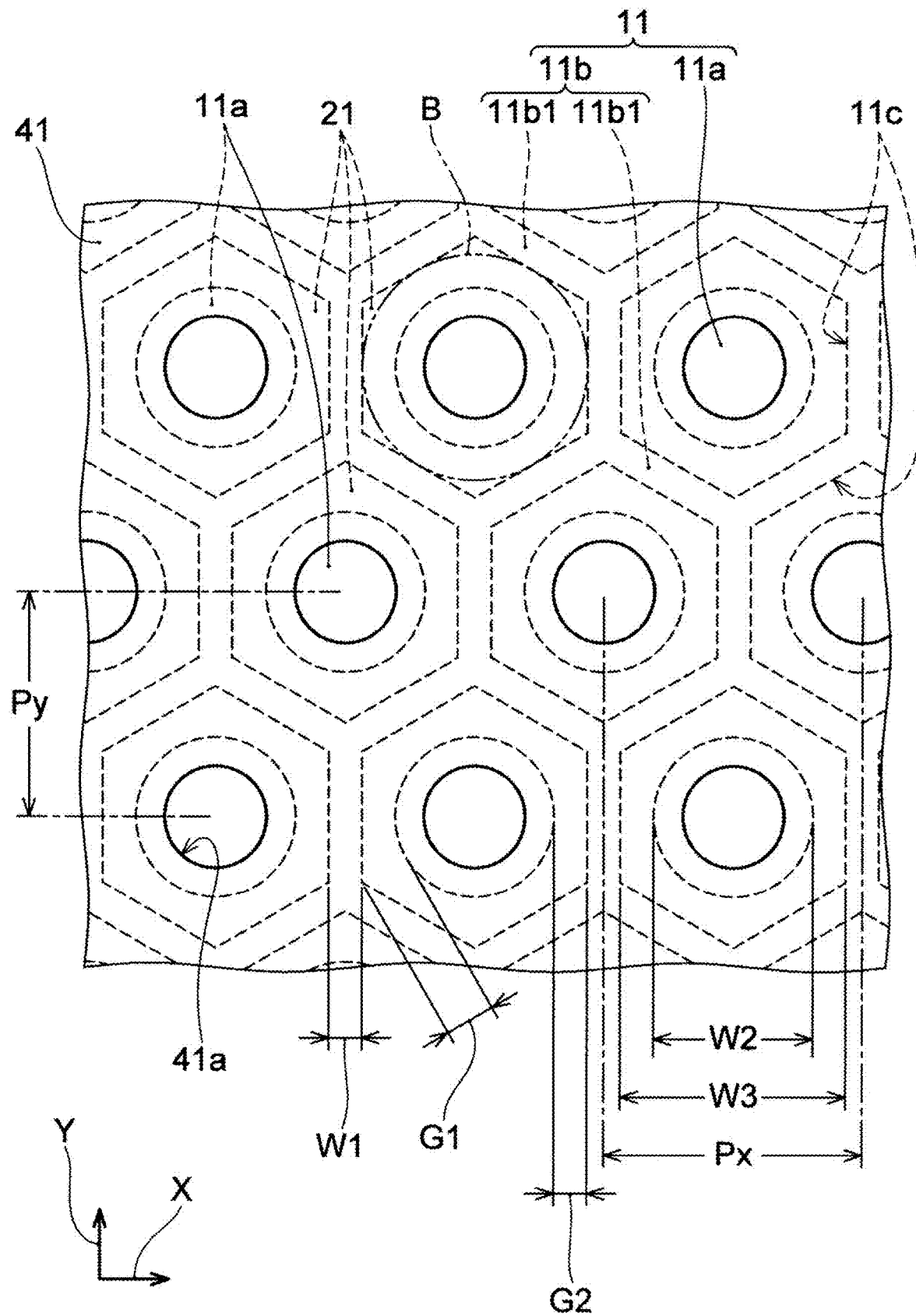
FIG. 4 is an enlarged view illustrating an example of a mesh-like conductor pattern of the wiring substrate according to the embodiment.

With reference to FIG. 4, an effect is described that is thought to be obtainable by a combination of the openings (11c) each having a polygonal shape such as a hexagonal shape and the conductor pads (11a) each having a curved outer edge such as a circular edge. FIG. 4 illustrates an enlarged view of arbitrary conductor pads (11a) and the mesh-like conductor pattern (11b) in the component mounting region (A) of FIGS. 2 and 3. The conductor pads (11a) are respectively exposed in the openings (41a) of the solder resist layer 41.

As illustrated in FIG. 4, in a portion where the conductor pads (11a) and conductor frames (11b1) of the mesh-like conductor pattern (11b) are not formed, a surface (upper surface) of the insulating layer 21 is exposed (specifically, the exposed portion of the insulating layer 21 is covered by the solder resist layer 41). Since each of the conductor pads (11a) has a curved shape on an outer edge, whereas each of the openings (11c) has a polygonal shape, a size of the exposed portion of the insulating layer 21 exposed in the openings (11c) is larger than that in the case where each of the openings (11c) has a circular shape indicated by a two-dot chain line (B) in FIG. 4.

In manufacturing the wiring substrate 1, the conductor layer 11 including the conductor pads (11a) and the like is formed, for example, using an additive method or the like including pattern plating. In that case, the multiple conductor pads (11a) formed at a fine pitch can be formed. In the formation of the conductor layer 11 by pattern plating, a plating resist (not illustrated in the drawings) is formed in a region on the insulating layer 21 where the conductor pads (11a) or the conductor frames (11b1) are not formed, and a metal such as copper is deposited in openings of the plating resist by electrolytic plating. That is, in FIG. 4, the plating resist is formed in a region where the exposed portion of the insulating layer 21 exposed in the openings (11c) is to be formed. However, when the exposed portion of the insulating layer 21 is small or has a small width, the plating resist formed on the small (narrow) exposed portion may tilt or collapse. In that case, the shape and size of each of the openings of the plating resist may change unintentionally, and as a result, it is possible that the conductor pads (11a) and the conductor frames (11b1) each having predetermined shape and size cannot be formed.

However, in the wiring substrate 1 of the present embodiment, as described above, the exposed portion of the insulating layer 21 exposed in the openings (11c) has a larger size or a larger width as compared to the case where each of the openings (11c) has, for example, a circular shape. Therefore, the plating resist used in the formation of the conductor layer 11 in manufacturing the wiring substrate 1 is easy to stabilize without tilting or collapsing on the insulating layer 21. Therefore, deformation of the openings of the plating resist is suppressed, and the conductor pads (11a) and the conductor frames (11b1) each having a predetermined shape or size can be stably formed.

Further, as in the example of FIGS. 1-4, when the solder resist layer 41 has the openings (41a) that respectively expose the conductor pads (11a), the present embodiment is beneficial also from a point of view of adhesion of the solder resist layer 41. That is, in the present embodiment, a contact area between the solder resist layer 41 and the insulating layer 21 is larger than that in the case where the mesh-like conductor pattern (11b) has circular openings (11c). It is thought that the solder resist layer 41 formed of a resin such as epoxy can adhere more firmly to the insulating layer 21 containing a resin such as epoxy than to the conductor frames (11b1) formed of a metal such as copper. Therefore, it is thought that adhesion strength of the solder resist layer 41 is improved, and peeling of the solder resist layer 41 is unlikely to occur.

A width of the conductor frames (11b1) formed together with the polygonal openings (11c) is substantially the same as a minimum width of conductor frames formed together with the circular openings indicated by the two-dot chain line (B). Therefore, it is thought that the conductor frames (11b1), that is, the mesh-like conductor pattern (11b) is formed as easily as a mesh-like conductor pattern having the circular openings indicated by the two-dot chain line (B) is formed. Further, regarding the above-described shielding effect, it is thought that the same effect as that obtained by the conductor frames surrounding the circular openings indicated by the two-dot chain line (B) is provided by the conductor frames (11b1) surrounding the polygonal openings (11c).

Examples of dimensions of parts of the conductor pads (11a) and the mesh-like conductor pattern (11b) in the wiring substrate 1 of the present embodiment are illustrated below with reference to FIG. 4.

A length (G1) of a maximum portion of a gap between a conductor pad (11a) and an inner edge of an opening (11c) of the mesh-like conductor pattern (11b) is, for example, 20 µm or more and 30 µm or less. On the other hand, a length (G2) of a minimum portion of the gap between the conductor pad (11a) and the inner edge of the opening (11c) is, for example, 10 µm or more and 20 µm or less. A difference between the length (G1) of the maximum portion and the length (G2) of the minimum portion is, for example, 6 µm or more and 10 µm or less. When the length of the gap between the conductor pad (11a) and the inner edge of the opening (11c) has such a value, the conductor pads (11a) can be formed at a narrow pitch, and it is thought that a short circuit between the conductor pads (11a) and the conductor frames (11b1) due to a solder or the like for connection is unlikely to occur. Further, as described above, formation of a defect pattern due to collapsing or the like of the plating resist in the formation of the conductor layer 11 can be suppressed.

Further, a width (W1) of each side of a conductor frame (11b1) interposed between adjacent conductor pads (11a) is, for example, 5 µm or more and 15 µm or less. When each of the conductor frames (11b1) has the width (W1) in this range, it is thought that the conductor pads (11a) can be formed at a narrow pitch and an effective shielding effect by the conductor frames (11b1) can be obtained.

Further, a maximum width (W2) along an X direction of each of conductor pads (11a) formed in a straight line at a pitch (Px) in the X direction of FIG. 4 (that is, the diameter of each of the conductor pads (11a) in the example of FIG. 4) is, for example, 60% or more and 80% of less of the pitch (Px). Further, in this case, a width (W3) along the X direction of each of the openings (11c) is, for example, 70% or more and 90% or less of the pitch (Px). It is thought that a required contact area between each of the conductor pads (11a) and a solder or the like for connection can be ensured, and a short circuit between the conductor pads (11a) and the conductor frames (11b1) due to a solder or the like is unlikely to occur. Further, as described above, formation of a defect pattern due to collapsing or the like of the plating resist in the formation of the conductor layer 11 can be suppressed.

In the example of FIGS. 2 and 4, a pitch (Py) of an array of conductor pads (11a) in a Y direction orthogonal to the X direction is different from the pitch (Px), and the pitch (Px) is longer than the pitch (Py).

As described above with reference to FIG. 1, the wiring substrate 1 includes the conductor layer 12 (second conductor layer). The conductor layer 12 is a conductor layer formed on an opposite side with respect to the conductor layer 11 of the insulating layer 21, and is a lower-layer conductor layer formed on a lower side of the conductor layer 11. On the other hand, for the conductor layer 12, the insulating layer 21 is an upper-layer insulating layer laminated on an upper side of the conductor layer 12 and the insulating layer 22. The insulating layer 21 includes the via conductors 51 (first via conductors) that penetrate the insulating layer 21 and connect the conductor layer 11 and the conductor layer 12 to each other. The conductor layer 12 includes conductor pads (12a). The conductor pads (12a) are respectively connected to the via conductors 51, and are respectively connected to the conductor pads (11a) (mounting pads) of the conductor layer 11 via the via conductors 51. The conductor pads (12a) are via pads provided so that the via conductors 51, and/or the via conductors 52 (second via conductors) in the insulating layer 22 are in proper contact with the conductor layer 12. Due to the via conductors 51, the conductor pads (11a) as the mounting pads can be connected to the conductor layer 12 (specifically, the conductor pads (12a)) via a shortest path.

In FIG. 5A, a plan view of the conductor layer 12 in the wiring substrate 1 of the present embodiment is illustrated together with the insulating layer 22. As illustrated in FIG. 5A, the conductor layer 12 further includes a mesh-like conductor pattern (12b) (second mesh pattern) having multiple openings (12c). Then, the conductor pads (12a) (via pads) are respectively formed inside the multiple openings (12c) of the mesh-like conductor pattern (12b).

The openings (12c) of the mesh-like conductor pattern (12b) expose the insulating layer 22. The openings (12c) each have a polygonal shape similar to the openings (11c) of the mesh-like conductor pattern (11b) included in the conductor layer 11. Further, each of the conductor pads (12a) included in the conductor layer 12 has a curved outer edge similar to the conductor pads (11a) included in the conductor layer 11. In the example of FIG. 5A, each of the conductor pads (12a) has a circular shape. Therefore, also in the formation of the conductor layer 12 in manufacturing the wiring substrate 1, similar to the formation of the conductor layer 11 described above, a plating resist that can be used in the formation of the conductor layer 12 is easy to stabilize without tilting or collapsing on the insulating layer 22. Therefore, the conductor pads (12a) and the mesh-like conductor pattern (12b) each having a predetermined shape or size can be stably formed. Further, similar to the suppression of peeling of the solder resist layer 41 described above, peeling between the insulating layer 21, which is an upper-layer insulating layer, and the insulating layer 22 and the conductor layer 12 can be suppressed.

The conductor layer 12 has a first region (A1) that overlaps in a plan view with the component mounting region (A) (see FIG. 2) in the component mounting surface (1a) (see FIG. 1). The first region (A1) includes a part or all of the mesh-like conductor pattern (12b). In the example of FIG. 5A, the first region (A1) includes substantially most of the mesh-like conductor pattern (12b). The conductor pads (12a) are formed at least in all the multiple openings (12c) on a one-to-one basis inside the first region (A1). It is thought that a shielding effect with respect to the conductor pads (12a) due to the mesh-like conductor pattern (12b) is obtained.

Without being limited to the example of FIG. 5A, the mesh-like conductor pattern (12b) of the conductor layer 12 may include openings (12c) each of which does not include a conductor pad (12a) therein. For example, the mesh-like conductor pattern (12b) may be formed on substantially an entire upper surface of the insulating layer 22. Then, in this case, a conductor pad (12a) may or may not be formed in each of the openings (12c) outside the first region (A1). Even when conductor pads (12a) are not formed in some of the openings (12c) outside the first region (A1), preferably, the conductor pads (12a) are formed at least in all the openings (12c) on a one-to-one basis inside the first region (A1).

As illustrated in FIG. 5A, lead-out wiring patterns (12d) are respectively connected to the conductor pads (12a) formed on an outermost periphery of the group of conductor pads (12a) formed in the openings (12c) of the mesh-like conductor pattern (12b). The lead-out wiring patterns (12d) are respectively connected to conductor pads (12e) provided outside the first region (A1). The conductor pads (12e) are via pads that are connected to the via conductors 52 formed in the insulating layer 22. That is, the conductor pads (12a) formed on an outer edge portion of the first region (A1) are electrically connected to the conductor layer 13 (see FIG. 1) via the lead-out wiring patterns (12d) and the conductor pads (12e). The conductor pads (12a) formed in the first region (A1) can be connected to any conductor pattern of any conductor layer via the lead-out wiring patterns (12d), for example, as in the example of FIG. 5A. In other words, the conductor pads (11a) (mounting pads) formed on the conductor layer 11 can be electrically connected to any conductor pad of any conductor layer via the conductor pads (12a) of the conductor layer 12.

A form of connecting the conductor pads (11a) of the conductor layer 11 to any other conductor pad is not limited to the example of FIGS. 1-4 and 5A. For example, the conductor layer 11 may include wiring patterns (not illustrated in the drawings) which are similar to the lead-out wiring patterns (12d) of the conductor layer 12 and are respectively connected to the conductor pads (11a) formed on an outer edge of the component mounting region (A). An example of the conductor layer 12 (lower-layer conductor layer) in this case is illustrated in FIG. 5B.

Figure 5B:
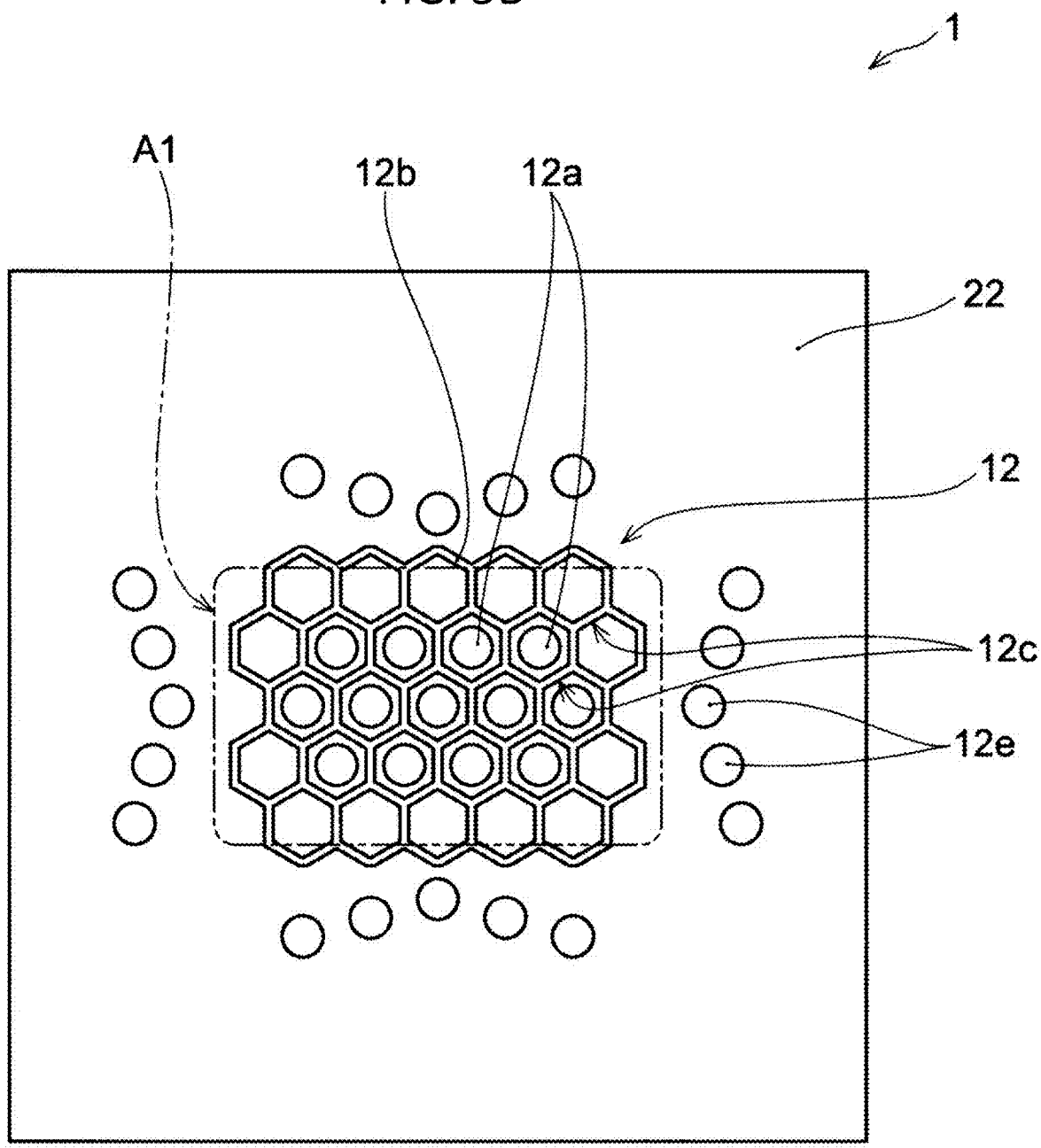
FIG. 5B is a plan view illustrating another example of a lower-layer conductor layer of the wiring substrate according to the embodiment of the present invention.

In the example of the conductor layer 12 illustrated in FIG. 5B, the conductor pads (12a) are not formed inside the openings (12c) formed in the outer edge portion of the first region (A1). This is because the conductor pads (11a) formed on the outer edge of the component mounting region (A) in the conductor layer 11 are connected to the wiring patterns (not illustrated in the drawings) extending to the outside the component mounting region (A). That is, in the first region (A1) of the conductor layer 12, it is not necessary to form conductor pads (12a) connected to the conductor pads (11a) formed on the outer edge of the component mounting region (A). As a result, the number of the via pads (conductor pads (12a)) formed in the first region (A1) of the conductor layer 12, which is the lower-layer conductor layer of the conductor layer 11, may be less than the number of the conductor pads (11a) formed in the component mounting region (A) of the conductor layer 11. It is possible that the same number of conductor pads (12a) as the conductor pads (11a) in the component mounting region (A) are formed in the first region (A1). However, it is possible that some of the conductor pads (12a) are not connected to the conductor pads (11a) in the component mounting region (A).

In the example of FIG. 5B, the conductor pads (12e) are provided as via pads outside the first region (A1). The conductor pads (11a) formed on the outer edge of the component mounting region (A) in the conductor layer 11 may be connected to the conductor layer 13 (see FIG. 1) via the wiring patterns (not illustrated in the drawings) connected to the conductor pads (11a), the via conductors 51, the conductor pads (12e), and the via conductors 52.

In the present embodiment, the conductor layer 13 may include a mesh-like conductor pattern containing multiple openings and conductor pads formed in the openings. That is, any conductor layer formed on any insulating layer may include a mesh-like conductor pattern that includes multiple openings each having a polygonal shape, and conductor pads that are respectively formed in the openings and each have a curved outer edge.

The shape of each of the openings (11c, 12c) of the mesh-like conductor patterns (11b, 12b) of the wiring substrate 1 is not limited to the hexagonal shape illustrated in FIG. 2. Further, the shape of each of the conductor pads (11a, 12a) is not limited to the substantially perfect circular shape illustrated in FIG. 2. FIGS. 6A-6D illustrate other examples of the mesh-like conductor pattern (11b) and the conductor pads (11a). It is thought that, also in the case where the mesh-like conductor pattern (11b) and/or the conductor pads (11a) are formed to have the shapes or positions illustrated in FIGS. 6A-6D, as described above, formation of a defect pattern can be suppressed. Examples illustrated in FIGS. 6A-6D can also be applied to the conductor pads (for example, the conductor pads (12a)) and the mesh-like conductor patterns (for example, the mesh-like conductor pattern (12b)) that can be included in the conductor layers other than the conductor layer 11.

Figure 6A:
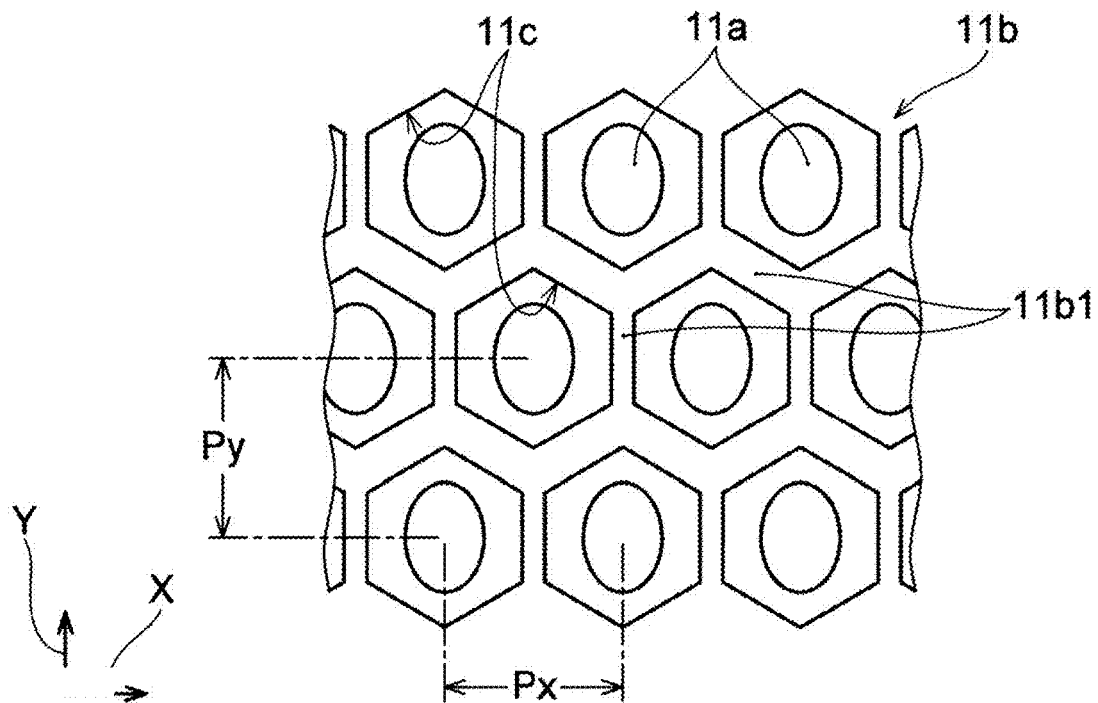
FIG. 6A is an enlarged view illustrating another example of a mesh-like conductor pattern of the wiring substrate according to the embodiment.

As illustrated in FIG. 6A, each of the conductor pads (11a) formed in the openings (11c) of the mesh-like conductor pattern (11b) may have an elliptical shape. The shape of each of the conductor pads (11a) may be a shape in which at least one side of a rectangle is formed by a circular arc or an elliptical arc. For example, the shape of each of the conductor pads (11a) may be a so-called rounded rectangle in which two opposing sides of a rectangle each are formed of half of a circumference of a circle.

Further, in the example of FIG. 6A, some of the sides of each of the conductor frames (11b1) have different widths from each other. In this way, it is not necessary for the widths of the sides of each of the conductor frames (11b1) to be the same. On the other hand, in the example of FIG. 6A, the formation pitches (Px, Py) of the conductor pads (11a) and the openings (11c) in the two orthogonal directions (for example, the X direction and the Y direction in FIG. 6A) are substantially equal to each other. When each of the openings (11c) has a hexagonal shape, the formation pitches of the conductor pads (11a) and the openings (11c) in the two orthogonal directions may be made substantially equal to each other by making the widths of some of the sides of each of the conductor frames (11b1) different from each other.

When each of the openings (11c) has a polygonal shape having more vertices than a quadrangle, for example, a hexagonal shape as in the examples of FIGS. 4 and 6A, in each of the conductor frames (11b1), an intersection angle between adjacent sides (an inner angle of a vertex of an opening (11c)) is an obtuse angle. In this case, it is thought that a disconnection at an intersection of sides of the conductor frames (11b1) is unlikely to occur. Therefore, openings (11c) each having a polygonal shape having 5 or more vertices, such as a regular hexagonal shape, may be preferable.

Figure 6B:
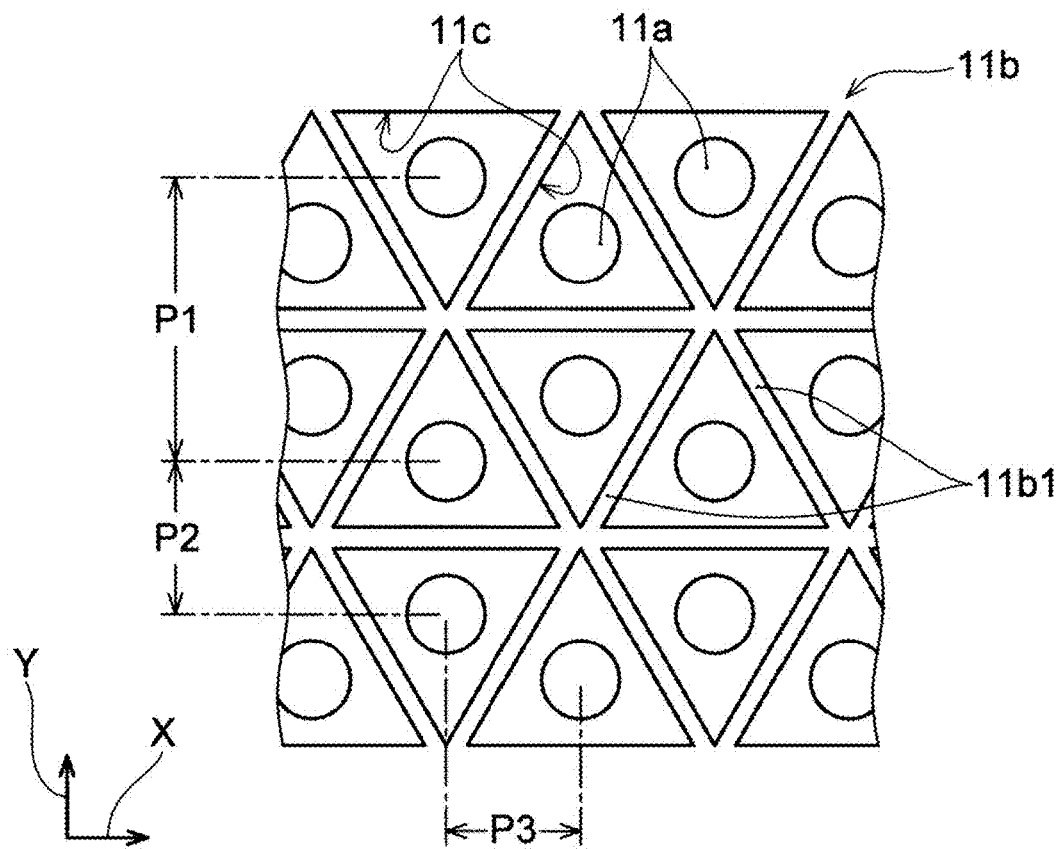
FIG. 6B is an enlarged view illustrating another example of a mesh-like conductor pattern of the wiring substrate according to the embodiment.

As illustrated in FIG. 6B, each of the openings (11c) may have a triangular shape. In the example of FIG. 6B, adjacent openings (11c) are formed such that one side of one triangular shape opposes one side of the other triangular shape, and each of the conductor frames (11b1) has a uniform width on all sides thereof. The conductor pads (11a) are formed in columns in one direction (the Y direction in FIG. 6B), and are formed alternately in two types of pitches (P1, P2) in the Y direction. On the other hand, in the X direction orthogonal to the Y direction, the conductor pads (11a) are formed in a zigzag pattern and at a constant pitch (P3).

Figure 6C:
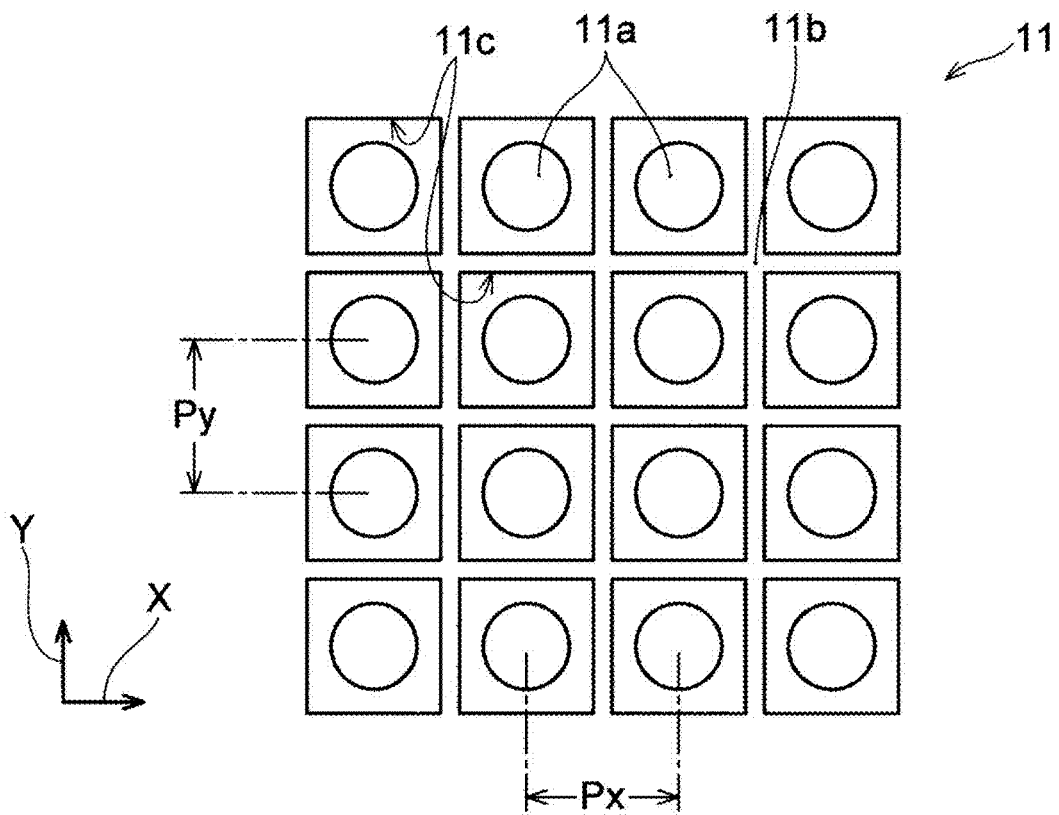
FIG. 6C is an enlarged view illustrating another example of a mesh-like conductor pattern of the wiring substrate according to the embodiment.
Figure 6D:
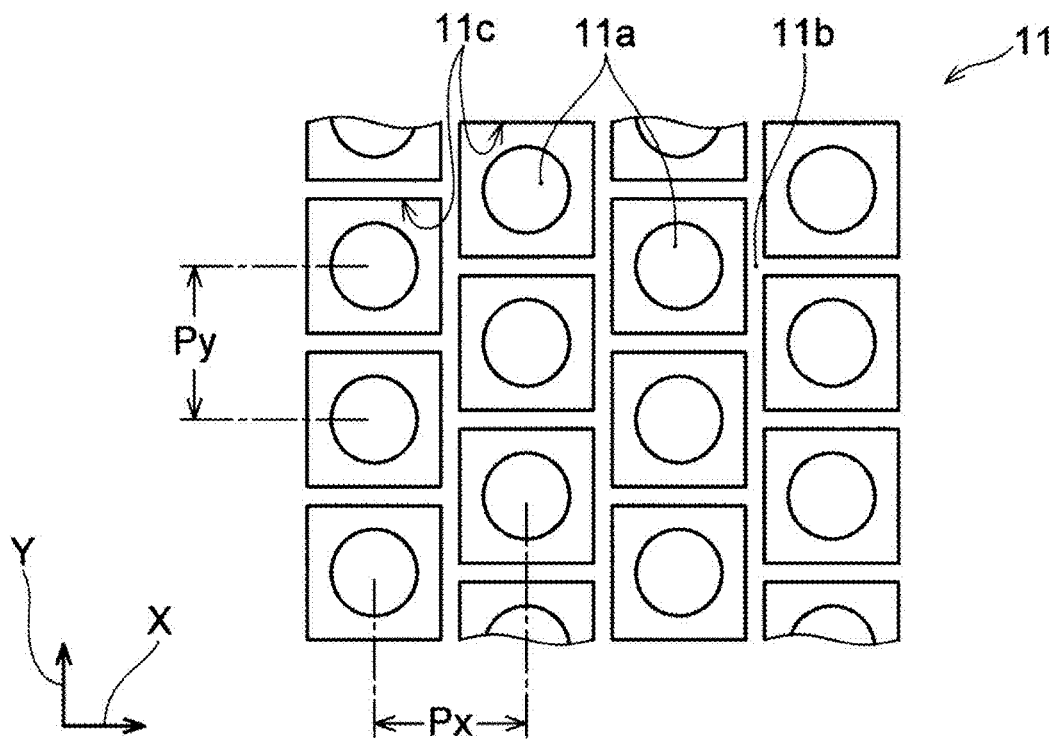
FIG. 6D is an enlarged view illustrating another example of a mesh-like conductor pattern of the wiring substrate according to the embodiment.

As illustrated in FIGS. 6C and 6D, each of the openings (11c) may have a quadrangular shape, for example, a square shape. In the example of FIG. 6C, adjacent openings (11c) are formed such that one side of a sequence shape opposes one side of the other square shape, and the mesh-like conductor pattern (11b) forms a lattice pattern. The multiple conductor pads (11a) are formed in rows or columns at a uniform pitch in both the X and Y directions, and the pitch (Px) in the X direction and the pitch (Py) in the Y direction are substantially equal to each other.

Also in the example of FIG. 6D, the conductor pads (11a) are formed in columns at a uniform pitch (Py) in the Y direction, and the columns of the conductor pads (11a) along the Y direction are formed at a uniform pitch (Px) in the X direction, the pitch (Px) being substantially equal to the pitch (Py). However, in the example of FIG. 6D, Y-direction positions of the conductor pads (11a) formed in the Y direction are shifted by a length half the pitch (Py) with respect to Y-direction positions of the conductor pads (11a) formed in an adjacent column in the X direction. As a result, the multiple conductor pads (11a) are formed in a so-called staggered formation in two adjacent rows (or two adjacent columns) in the X direction or the Y direction. Therefore, a linear distance between adjacent conductor pads (11a) can be increased, and a short circuit due to a solder or the like between conductor pads (11a) can be suppressed.

Next, using a case where the wiring substrate 1 of FIG. 1 is manufactured as an example, a method for manufacturing the wiring substrate of the embodiment is described with reference to FIGS. 7A-7D.

Figure 7A:
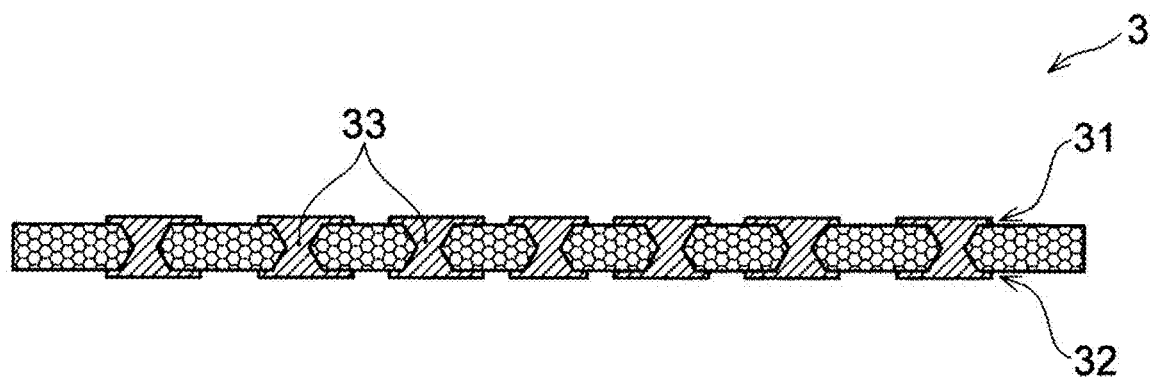
FIG. 7A is a cross-sectional view illustrating an example of a state before formation of a mesh-like conductor pattern in a method for manufacturing a wiring substrate according to an embodiment of the present invention.

As illustrated in FIG. 7A, first, the core substrate 3 of the wiring substrate 1 is formed. In the formation of core substrate 3, for example, a double-sided copper-clad laminated plate is prepared, and, by irradiating $CO_2$ laser from both sides thereof, through-holes are formed at formation positions of the through-hole conductors 33. On inner walls of the through holes and on both sides of the double-sided copper-clad laminated plate, a plating base film formed of copper or the like, which serves as a feeding layer for electrolytic plating in the next process, is formed by electroless plating or the like. Then, an electrolytic plating film is formed on the plating base film by electrolytic plating. Along with this, the through holes are filled with the electrolytic plating film, and the through-hole conductors 33 are formed. After that, unnecessary portions of the copper foil on both sides of the double-sided copper-clad laminated plate, the plating base film, and the electrolytic plating film are removed by etching using a mask having appropriate openings. As a result, the conductor layer 31 and the conductor layer 32 each including a desired conductor pattern are formed. For example, the core substrate 3 is formed using such a method.

Figure 7B:
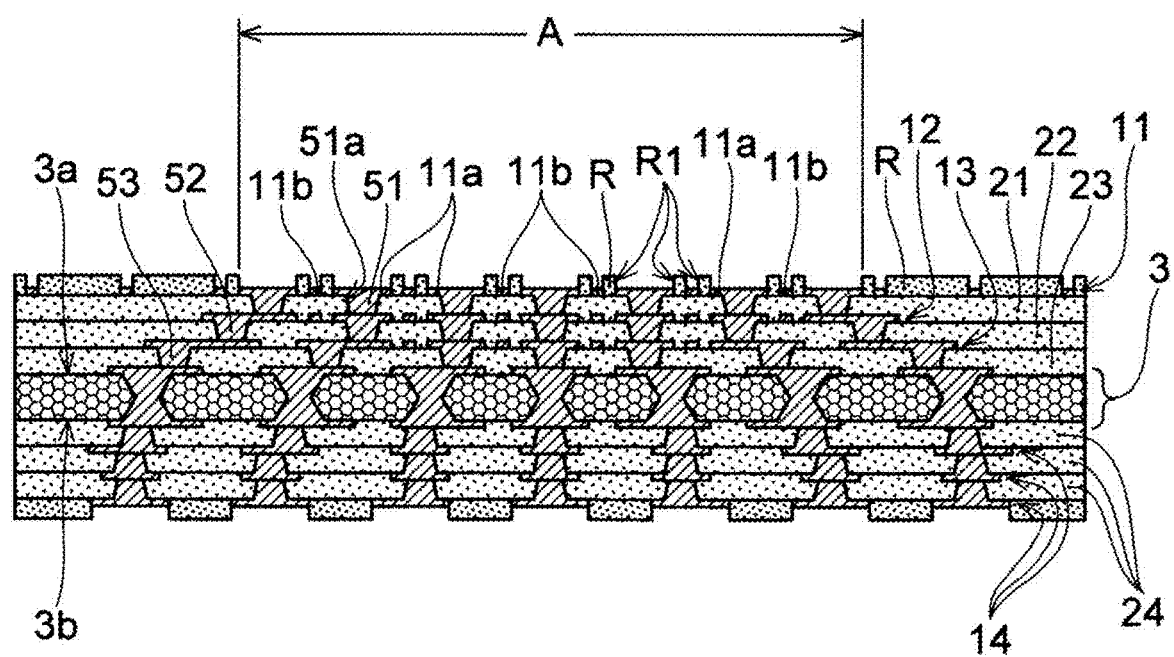
FIG. 7B is a cross-sectional view illustrating an example of a formation process of the mesh-like conductor pattern in the method for manufacturing a wiring substrate according to the embodiment of the present invention.

As illustrated in FIG. 7B, the method for manufacturing the wiring substrate of the present embodiment includes forming an insulating layer, and forming a conductor layer on the formed insulating layer. When the wiring substrate 1 is manufactured using the manufacturing method of the present embodiment, the insulating layer 23 is formed on the first surface (3a) of the core substrate 3, and the conductor layer 13 is formed on the insulating layer 23. Further, the insulating layer 22 is formed on the conductor layer 13, and the conductor layer 12 is formed on the insulating layer 22. Then, the insulating layer 21 is formed on the conductor layer 12, and the conductor layer 11 is formed on the insulating layer 21. The three insulating layers 24 and the three conductor layers 14 are alternately formed on the second surface (3b) of the core substrate 3.

For the formation of the insulating layers and the conductor layers, for example, a general method for manufacturing a build-up substrate may be used. For example, the insulating layer 23 is formed by thermocompression-bonding a film-like insulating resin (for example, an epoxy resin) onto the first surface (3a) of the core substrate 3. Through holes are formed at formation sites of the via conductors 53 in the insulating layer 23, for example, by irradiating $CO_2$ laser. The insulating layer 22 and the insulating layer 21 are also formed using the same method as the insulating layer 23. Through holes (51a) are formed at formation points of the via conductors 51 in the insulating layer 21. At the same time as each of the insulating layers (23-21) is formed, the three insulating layers 24 are formed one by one on the second surface (3b) of the core substrate 3.

Figure 7C:
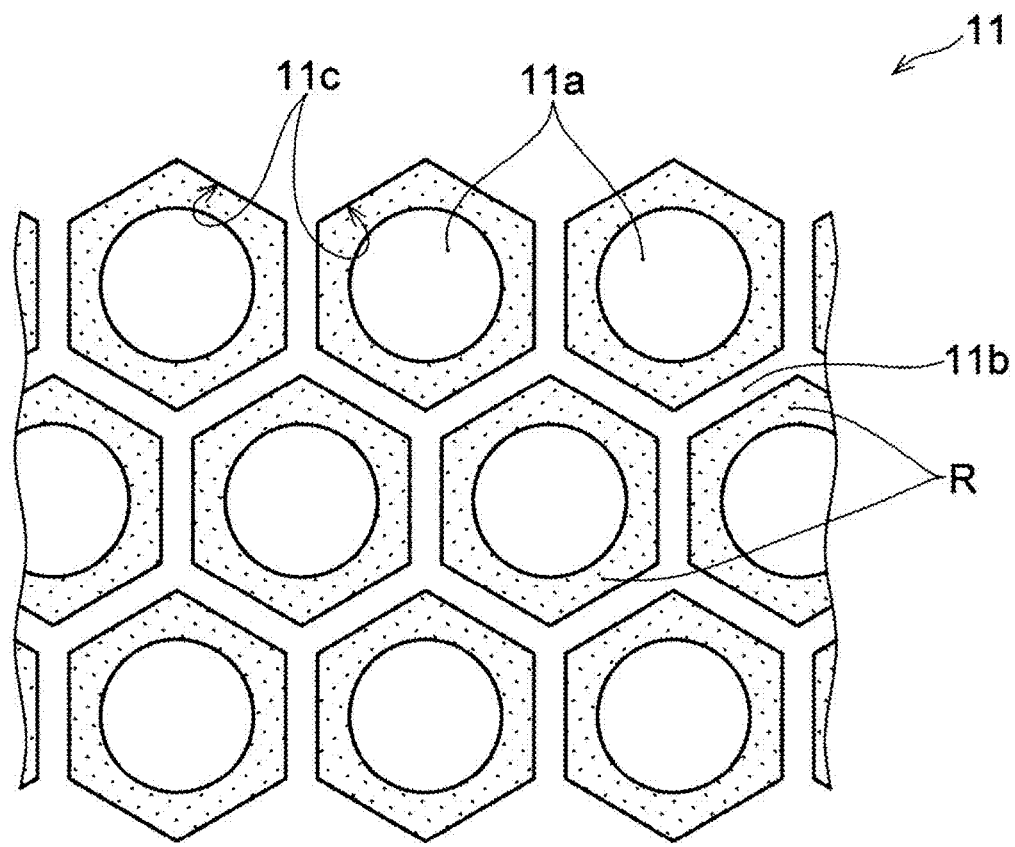
FIG. 7C is an enlarged plan view illustrating the example of the formation process of the mesh-like conductor pattern in the method for manufacturing a wiring substrate according to the embodiment of the present invention.

As illustrated in FIG. 7C, in the method for manufacturing the wiring substrate of the present embodiment, the forming of one of the conductor layers includes forming the mesh-like conductor pattern (11b) including the multiple openings (11c) each having a polygonal shape, and forming the conductor pads (11a) each having a curved outer edge. FIG. 7C is an enlarged plan view illustrating an example about the conductor layer 11. The conductor pads (11a) are formed along with the formation of the mesh-like conductor pattern (11b) and are respectively formed at substantially centers of the multiple openings (11c) with gaps formed between the conductor pads (11a) and the surrounding conductor pattern (11b). When the wiring substrate 1 is manufactured, at least in the formation of each of the conductor layer 11 and the conductor layer 12, a mesh-like conductor pattern and conductor pads in the openings thereof are formed.

In the method for manufacturing the wiring substrate of the present embodiment, each of the conductor layers can be formed using any method, for example, using a subtractive method or the semi-additive method (SAP method). However, in the present embodiment, a conductor layer including a mesh-like conductor pattern (for example, the mesh-like conductor pattern (11b)) and conductor pads formed in openings thereof (for example, the conductor pads (11a)) described above is formed using an SAP method or the like that includes pattern plating. In manufacturing the wiring substrate 1, at least the conductor layer 11 and the conductor layer 12 are formed using a method that includes pattern plating. Using the formation of the conductor layer 11 as an example, an example of a method for forming the mesh-like conductor pattern (11b) and the conductor pads (11a) using an SAP method is described with reference to FIGS. 7B and 7C.

As illustrated in FIGS. 7B and 7C, the forming of the conductor layer 11 in the manufacturing method of the present embodiment includes forming a resist film (R) on the insulating layer 21 in a region other than a region where the mesh-like conductor pattern (11b) or the conductor pads (11a) are to be formed. In FIG. 7C, the resist film (R) is hatched with a dot pattern, similar to the resist film (R) in FIG. 7B.

The resist film (R) is formed before the formation of the mesh-like conductor pattern (11b) and the conductor pads (11a). First, a plating base film (not illustrated in the drawings) formed of a conductor such as copper is formed on inner walls of the through holes (51a) of the insulating layer 21 and on the surface of the insulating layer 21 by electroless plating, sputtering, or the like. The resist film (R) is formed on the plating base film. For example, a photosensitive liquid or film-like resist material is supplied onto the plating substrate film, exposed using an exposure mask having appropriate openings, and then developed. As a result, the resist film (R) having openings (R1) at predetermined regions is formed. The openings (R1) are provided in regions corresponding to regions where the mesh-like conductor pattern (11b) or the conductor pads (11a) are to be formed in the resist film (R). The regions where the conductor pads (11a) are to be formed are surrounded by the resist film (R). On the other hand, formation of a conductor, for example, formation of an electrolytic plating film, in regions (conductor non-formation regions) where the mesh-like conductor pattern (11b) and conductor pads (11a) are not to be formed is prevented by the resist film (R).

The conductor layer 11 is formed, for example, by electrolytic plating using the above-described plating base film as a power feeding layer. An electrolytic plating film is deposited in the openings (R1) of the resist film (R), and the mesh-like conductor pattern (11b) and the conductor pads (11a) are formed in the openings (R1). Further, the via conductors 51 formed of a plating base film and an electrolytic plating film are formed in the through holes (51a).

Each of the openings (11c) of the mesh-like conductor pattern (11b) formed using the method of the present embodiment has a polygonal shape. On the other hand, each of the conductor pads (11a) formed in the openings (11c) has a curved outer edge. Therefore, as described above, the resist film (R) is unlikely to tilt or collapse in the formation of the conductor layer 11. Therefore, the conductor pads (11a) and the mesh-like conductor pattern (11b) each having a predetermined shape or size can be stably formed. In the example of FIG. 7C, each of the openings (11c) has a hexagonal shape, specifically, a substantially regular hexagonal shape. In the example of FIG. 7C, each of the conductor pads (11a) has a circular shape, specifically, a substantially perfect circular shape. The conductor layer 12 and the conductor layer 13 can also be formed using the same method as the conductor layer 11. Therefore, it is thought that a conductor pattern having a predetermined shape or size can be stably formed in each of the conductor layers.

When the wiring substrate 1 is manufactured, a part of the mesh-like conductor pattern (11b) is formed in the component mounting region (A) which is the region where an external component is to be mounted on the wiring substrate 1. Further, the mesh-like conductor pattern (12b) included in the conductor layer 12 is formed in a region (first region) that overlaps with the component mounting region (A) in a plan view. Then, the conductor pads (11a) are formed at least in all the multiple openings (11c) on a one-to-one basis in the component mounting region (A). Further, the conductor pads (12a) included in the conductor layer 12 are formed in all the multiple openings (12c) on a one-to-one basis inside the first region. As described above, it is thought that a good shielding effect can be obtained with respect to each of the conductor pads (11a) and each of the conductor pads (12a).

In the conductor layers of the wiring substrate 1, it is possible that the mesh-like conductor pattern (11b) or the mesh-like conductor pattern (12b) is formed only in the component mounting region (A) or only in the first region. That is, in the conductor layer 11, the entire mesh-like conductor pattern (11b) may be formed in the component mounting region (A), and, in the conductor layer 12, the entire mesh-like conductor pattern (12b) may be formed in the first region.

On the second surface (3b) side of the core substrate 3, at the same time as the formation of the conductor layers (11-13) described above, the three conductor layers 14 are formed one by one. After the formation of the conductor layers, the resist film (R) is removed using any solvent. Further, the plating base film (not illustrated in the drawings) exposed by the removal of the resist film (R) is removed, for example, by etching.

Figure 7D:
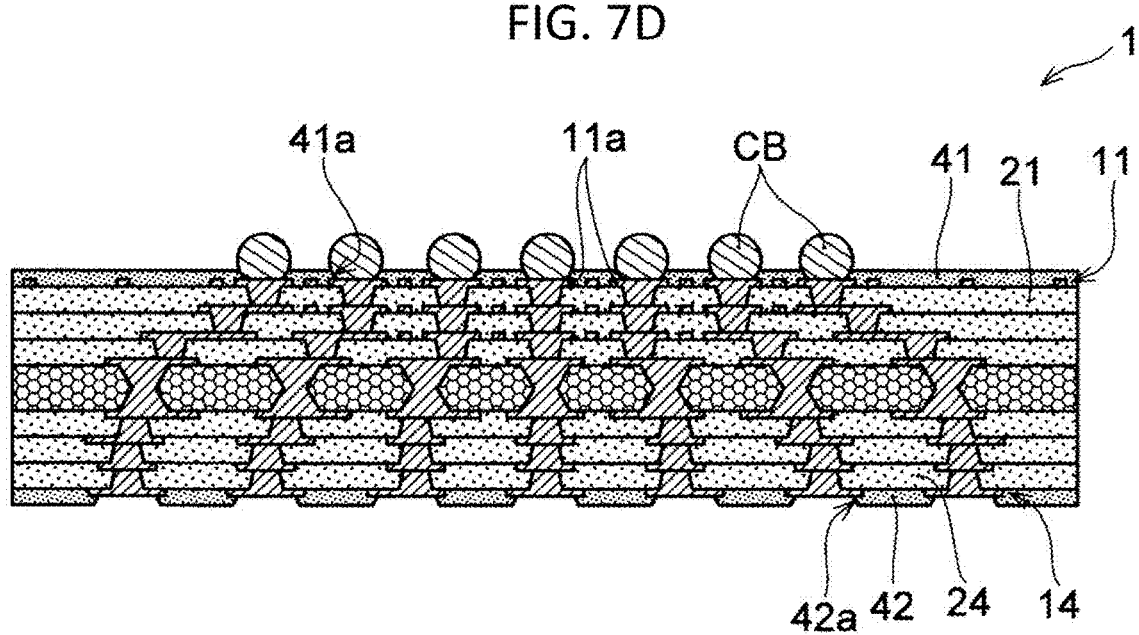
FIG. 7D is a cross-sectional view illustrating an example of a state after bump formation in the method for manufacturing a wiring substrate according to the embodiment of the present invention.

As illustrated in FIG. 7D, the method for manufacturing the wiring substrate of the present embodiment may include forming the solder resist layer 41 on the insulating layer 21 which is an outermost insulating layer and on the conductor layer 11 which is an outermost conductor layer. Further, the method for manufacturing the wiring substrate of the present embodiment may include forming the solder resist layer 42 on the outermost insulating layer 24 among the three insulating layers 24 and on the outermost conductor layer 14 among the three conductor layers 14. The solder resist layers (41, 42) are each formed, for example, by coating or spraying a photosensitive epoxy resin or a photosensitive polyimide resin, or the like. In the solder resist layer 41, the openings (41a) that respectively individually expose the conductor pads (11a) are respectively provided for the conductor pads (11a) by exposure and development using a mask having appropriate opening patterns. The openings (42a) are provided in the solder resist layer 42 using the same method.

As illustrated in FIG. 7D, the method for manufacturing the wiring substrate of the present embodiment may include respectively forming conductive bumps (CB) on the conductor pads (11a). The conductive bumps (CB) are formed, for example, by forming solder balls on conductor pads (11a), performing a reflow treatment, and the like. The conductive bumps (CB) may be formed by deposition of a plating film of a metal such as copper or nickel by electrolytic plating. Further, the method for manufacturing the wiring substrate of the present embodiment may include forming a surface protective film (not illustrated in the drawings) including a plated metal film or an organic film on each of the conductor pads (11a). For example, a surface protective film formed of Au, Ni/Au, Ni/Pd/Au, solder, heat-resistant preflux, or the like can be formed by electroless plating, solder leveling, spray coating, or the like. For example, the wiring substrate 1 can be manufactured through the above processes.

The wiring substrate of the embodiment is not limited to those having the structures illustrated in the drawings and those having the structures, shapes, and materials exemplified in the present specification. For example, a mesh-like conductor pattern and conductor pads in openings thereof may also be provided in a conductor layer on the second surface (3b) side of the core substrate 3. Further, it is not always necessary to provide the via conductors and the through-hole conductors 33, and it is not always necessary to provide the solder resist layers (41, 42).

The method for manufacturing the wiring substrate of the embodiment is not limited the method described with reference to the drawings. For example, it is also possible that the insulating layers (21-23) and the conductor layers (11-13) are not formed on the core substrate, but are formed on a separately prepared support plate, and after that, the support plate may be removed. In the method for manufacturing the wiring substrate of the embodiment, it is also possible that any process other than the processes described above is added, or some of the processes described above are omitted.

In the printed wiring substrate of Japanese Patent Application Laid-Open Publication No. 2007-141975, each of the conductor pads has a circular shape, and an inner edge of each of the surrounding conductors surrounding the conductor pads also has a substantially circular shape. Therefore, the clearance between the conductor pads and the surrounding conductors has substantially the same width over the entire circumference of each of the conductor pads, and the clearance is partially narrowed by the bridge parts. When the width of the clearance is small, it is possible that the conductor pads, the bridge parts and the like each having a desired shape cannot be formed accurately.

A wiring substrate according to an embodiment of the present invention includes: an insulating layer; and a conductor layer formed on the insulating layer. The conductor layer includes: a mesh-like conductor pattern having multiple openings that expose the insulating layer; and conductor pads that are formed at substantially centers of some of the multiple openings or at substantially centers of all of the multiple openings. Each of the multiple openings has a polygonal shape. Gaps are formed between the conductor pads and the conductor pattern surrounding the conductor pads. Each of the conductor pads has a curved outer edge.

A method for manufacturing a wiring substrate according to another embodiment of the present invention includes: forming an insulating layer; and forming a conductor layer on the insulating layer. The forming of the conductor layer includes: forming a mesh-like conductor pattern having multiple openings each having a polygonal shape; along with the forming of the mesh-like conductor pattern, forming conductor pads each having a curved outer edge at substantially centers of the multiple openings with gaps formed between the conductor pads and the surrounding conductor pattern; and, prior to the forming of the mesh-like conductor pattern and the conductor pads, forming a resist film in a region other than a region where the mesh-like conductor pattern or the conductor pads are to be formed.

According to an embodiment of the present invention, a conductor pattern having a desired shape can be obtained with high accuracy in a wiring substrate.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:
   an insulating layer; and
   a conductor layer formed on the insulating layer and including a mesh-like conductor pattern and a plurality of conductor pads such that the mesh-like conductor pattern has a plurality of openings exposing the insulating layer and that the plurality of conductor pads is formed at substantially centers of selected ones or all of the openings respectively,
   wherein the conductor layer is formed such that each of the openings has a polygonal shape, that gaps are formed between the conductor pads and the conductor pattern surrounding the conductor pads, and that each of the conductor pads has a curved outer edge.

2. The wiring substrate according to claim 1, wherein the conductor layer is formed such that each of the conductor pads has a circular shape.

3. The wiring substrate according to claim 1, wherein the conductor layer is formed such that the polygonal shape of each of the openings is a hexagonal shape.

4. The wiring substrate according to claim 1, wherein the insulating layer is formed such that the insulating layer has a component mounting region configured to mount an external component such that the component mounting region includes at least a part of the mesh-like conductor pattern.

5. The wiring substrate according to claim 4, wherein the conductor layer is formed such that the conductor pads are formed in all of the openings respectively at least in the component mounting region.

6. The wiring substrate according to claim 4, wherein the conductor layer is formed such that at least all of the openings in the component mounting region have substantially a same size and a same shape with respect to each other.

7. The wiring substrate according to claim 4, wherein the conductor layer is formed such that the plurality of conductor pads includes a plurality of mounting pads configured to connect an external component.

8. The wiring substrate according to claim 4, further comprising:
a lower-layer conductor layer formed on an opposite side with respect to the conductor layer on the insulating layer; and
a plurality of via conductors formed in the insulating layer such that the plurality of via conductors is connecting the conductor layer and the lower-layer conductor layer,
wherein the lower-layer conductor layer includes a plurality of via pads connected to the plurality of conductor pads via the plurality of via conductors respectively.

9. The wiring substrate according to claim 8, wherein the lower-layer conductor layer further includes a mesh-like conductor pattern having a plurality of openings such that the plurality of via pads is formed inside the plurality of openings of the mesh-like conductor pattern in the lower-layer conductor layer.

10. The wiring substrate according to claim 8, wherein the lower-layer conductor layer is formed such that a number of the via pads formed in the lower-layer conductor layer in a region overlapping the component mounting region is smaller than a number of the conductor pads formed in the component mounting region.

11. The wiring substrate according to claim 1, further comprising:
an upper-layer insulating layer laminated on the conductor layer; and
a plurality of via conductors formed through the upper-layer insulating layer such that the plurality of conductor pads is connected to the plurality of via conductors, respectively.

12. The wiring substrate according to claim 11, wherein the upper-layer insulating layer has a component mounting surface configured to mount an external component such that the conductor layer has a first region overlapping with a mounting region of the external component in the component mounting surface and includes at least a part of the mesh-like conductor pattern in the first region, and the conductor layer is formed such that the plurality of conductor pads is formed in all of the plurality of openings at least inside the first region, respectively.

13. The wiring substrate according to claim 12, further comprising:
a plurality of mounting pads formed on the component mounting surface of the upper-layer insulating layer such that the plurality of mounting pads is configured to connect the external component and that the plurality of conductor pads is electrically connected to the plurality of mounting pads via the plurality of via conductors.

14. The wiring substrate according to claim 1, wherein the conductor layer is formed such that a maximum length in each of the gaps between one of the conductor pads and an inner edge of a respective one of the openings is in a range of 20 µm to 30 µm.

15. The wiring substrate according to claim 14, wherein the conductor layer is formed such that a difference between the maximum length and a minimum length in each of the gaps between the one of the conductor pads and the inner edge of the respective one of the openings is in a range of 6 µm to 10 µm.

16. A method for manufacturing a wiring substrate, comprising:
forming an insulating layer; and
forming a conductor layer on the insulating layer,
wherein the forming of the conductor layer includes forming a resist film for forming the conductor layer including a mesh-like conductor pattern and a plurality of conductor pads, forming the mesh-like conductor pattern having a plurality of openings such that each of the openings has a polygonal shape, and forming the plurality of conductor pads at substantially centers of selected ones of or all of the openings respectively such that each of the conductor pads has a curved outer edge and that gaps are formed between the conductor pads and the surrounding conductor pattern.

17. The method for manufacturing a wiring substrate according to claim 16, wherein the conductor layer is formed such that the polygonal shape of each of the openings is a hexagonal shape.

18. The method for manufacturing a wiring substrate according to claim 16, wherein the insulating layer is formed such that the insulating layer has a component mounting region in which an external component is mounted such that the component mounting region includes at least a part of the mesh-like conductor pattern, and the conductor layer is formed such that the plurality of conductor pads is formed in all of the plurality of openings at least inside the component mounting region, respectively.

19. The method for manufacturing a wiring substrate according to claim 16, further comprising:
forming a solder resist layer on the insulating layer and the conductor layer.

20. The method for manufacturing a wiring substrate according to claim 16, further comprising:
forming a plurality of conductive bumps on the plurality of conductor pads in the conductor layer, respectively.

* * * * *